United States Patent

[11] 3,566,207

[72] Inventor Clark N. Adams
Courbevoie, France

[21] Appl. No. 825,725
[22] Filed May 19, 1969
[45] Patented Feb. 23, 1971
[73] Assignee The Singer Company

[54] SILICON-TO-GOLD BONDED STRUCTURE AND METHOD OF MAKING THE SAME
7 Claims, 6 Drawing Figs.

[52] U.S. Cl. .......... 317/234, 317/235, 29/589, 29/591, 29/625, 29/628, 29/630, 113/119
[51] Int. Cl. .......... H01l 1/14
[50] Field of Search .......... 317/234, 235, 3, 5, 5.2, 5.3, 5.4, 22; 174/(F.P.); 29/589, 591, 624, 625, 626, 627, 678, 630; 113/119

[56] References Cited

UNITED STATES PATENTS

| | | | |
|---|---|---|---|
| 2,973,466 | 2/1961 | Atalla et al. .......... | 317/240 |
| 3,458,925 | 8/1969 | Napier et al. .......... | 29/578 |
| 3,480,841 | 11/1969 | Castrucci et al. .......... | 317/234 |

*Primary Examiner*—John W. Huckert
*Assistant Examiner*—R. F. Polissack
*Attorneys*—Patrick J. Schlesinger, Charles R. Lepchinsky, R. Perry Shipman and Jay Cantor

ABSTRACT: A silicon chip, constituting the substrate of an integrated circuit, is coated first with chromium, and then tin, to provide a surface that will bond at temperatures as low as 217° C. to a gold-surfaced mounting pad.

INVENTOR.
Clark N. Adams
BY
R. Perry Shipman
AGENT

SILICON-TO-GOLD BONDED STRUCTURE AND METHOD OF MAKING THE SAME

BACKGROUND OF THE INVENTION

1. Field of the Invention

The present invention relates to the mounting and bonding of integrated circuit chips, or wafers, on a mounting pad of a lead frame.

2. Description of the Prior Art

It is known that silicon substrates of integrated circuit chips may be bonded directly to gold-surfaced mounting pads of lead frames by the formation of gold silicon eutectic alloy at a temperature of about 370° C. Heating of integrated circuits on a silicon chip to a temperature of 370° C is undesirable, since such a high temperature is high enough to cause degradation of the circuits, for example, those having chromium or aluminum in proximity to gold.

Further, it is well known that such a silicon chip may be bonded to a gold surface lead frame by means of a gold-tin solder, preferably as a preform. Although gold-tin solder melts at 217° C, the use of such solder, even as a preform, adds greatly to the difficulties and expense of the assembly.

SUMMARY

A preferred embodiment of the present invention is achieved by coating the reverse side of a silicon substrate having an integrated circuit formed on its obverse side with chromium, and then with tin, preferably by vapor-phase deposition before it is separated into individual circuit chips. The resulting tin surface is applied, at a temperature of about 217° C, to a gold-surfaced support, such as a mounting pad on a lead frame, and is bonded thereto by the formation of a gold-tin eutectic bond.

Therefore, it is an object of the present invention to provide an improved silicon-to-gold bonded structure.

It is another object of the present invention to provide an improved and novel method for bonding a silicon substrate to a gold-surfaced base member.

Still another object of the present invention is to provide a method for bonding an integrated circuit chip to a base member without temperature degrading the circuit components.

These and other objects and advantages will be apparent from the description of one specific embodiment of the present invention set forth below when read in connection with the accompanying drawings.

DESCRIPTION OF A PREFERRED EMBODIMENT

Figure 1:
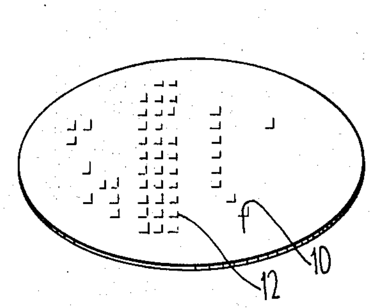
FIG. 1 is a pictorial view of the obverse side of a silicon wafer on which a plurality of integrated circuits are formed.
Figure 2:
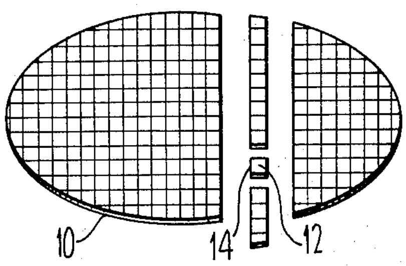
FIG. 2 is a view similar to FIG. 1, showing the breaking of the wafer into individual integrated circuit chips.
Figure 3:
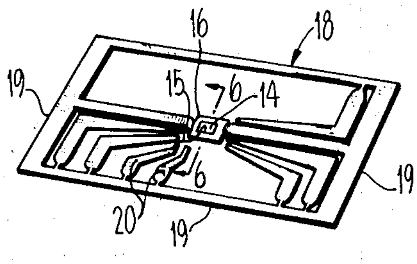
FIG. 3 is a pictorial view of a single integrated circuit chip mounted on a lead frame according to the present invention.

FIG. 1 is a pictorial representation of a thin silicon wafer 10, usually about one inch in diameter, cut from a silicon crystal. A plurality of individual integrated circuits 12 are formed on the upper or obverse plane surface of the wafer 10. Thereafter, as indicated in FIG. 2, the wafer 10 is scribed and divided into a plurality of chips, or dice, 14, each of which contains one of the integrated circuits 12. Such chips may range in size from about .040 to about .170 inch on a side. As shown in FIG. 3 each such chip 14 is bonded to a central mounting pad 16 of a lead frame 18. Circuit connections are made with fine wire jumpers 15 (only one jumper 15 is shown in FIG. 3) from the chip 14 to leads 20. The central portion of the resulting structure may be encapsulated in plastic material (not shown) for enclosing and supporting the parts, and the outside peripheral portions 19 of the lead frame 18 are trimmed for leaving the terminal leads 20 extending from the plastic encapsulation.

Figure 6:
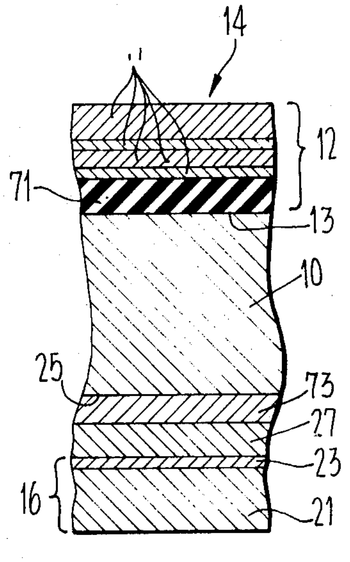
FIG. 6 is a view looking in the direction of arrows 6–6 of FIG. 3.

The present invention provides an improved and novel structure for and method of bonding a chip 14 to a mounting pad 16. As shown in FIG. 6, integrated circuits 12 on the obverse side or surface 13 of the silicon wafer 10 includes a plurality of patterned deposits or layers of metal 11, such as chromium, gold, and aluminum, and silicon dioxide 71, at least some of which will diffuse into each other and degrade the circuit thus formed if heated to too high a temperature.

The lead frame and of course the mounting pad 16 is constructed of nickel-cobalt-iron alloy 21, having a coefficient of thermal expansion close to that of silicon. The nickel-c obalt-iron alloy is plated with gold 23. Heretofore, the clean silicon reverse side or surface 25 of the chip 14 has been bonded to the gold-plated mounting pad 16 by holding the parts in contact and bringing the assembly to a temperature of approximately 370° C, the melting temperature of a gold-silicon eutectic. However, a temperature of 370° C can damage the integrated circuits 12. In particular, degradation of the integrated circuits at a temperature of about 300° C has been observed.

Alternatively, such chips 14 have been bonded to gold-surfaced lead frames by a gold-tin eutectic solder melting at 270° C. For example, the lead frame 18 may be held on a heat table, a small preform of gold-tin solder laid on the mounting pad 16 of the lead frame, where it melts, and the chip 14 then set in place on the molten solder, and the assembly then lifted off the heat table. However, such an operation requires excessive handling of the small parts.

In accordance with the present invention, the reverse side 25 of the chip 14 is provided with a coating of tin 27. When a tin coating 27 of the chip is applied to the surface of the gold coating 23 of the lead frame at a temperature of about 217° C, the two metals (gold and tin) form a eutectic bond. However, tin does not adhere well to the silicon and, therefore, in accordance with the present invention, a layer of chromium 73 which adheres well to the silicon, is first applied to the reverse surface 25 of the silicon wafer 10 and then the layer of tin 27 is applied over the chromium. Preferably, the chromium and tin are applied to the back of the wafer 10 before being broken into chips, such as 14, as shown in FIG. 2. The details of the method of making the structure shown in FIG. 6 will now be described.

Figure 4:
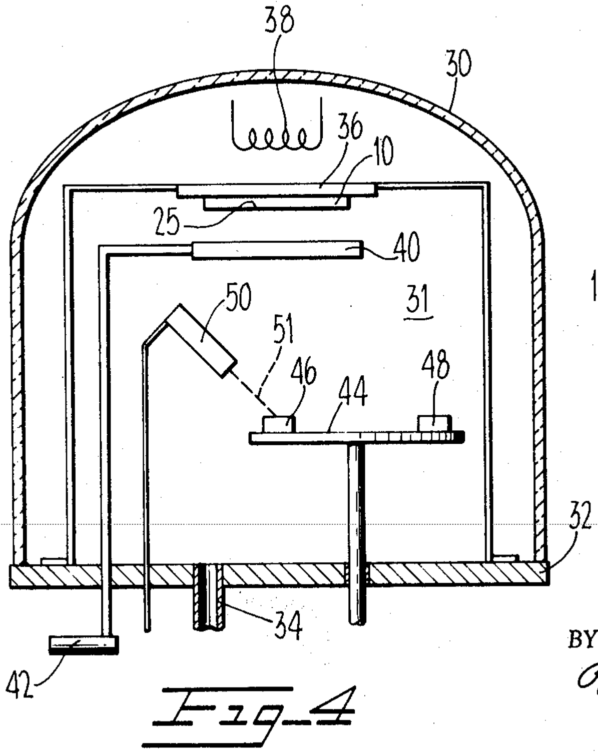
FIG. 4 is a simplified illustration of apparatus for vapor depositing metal on the surface of a wafer.

The integrated circuits 12 are constructed on the obverse surface 13 of silicon wafer 10 according to any desired well-known method. The reverse surface 25 of the silicon wafer 10 is cleaned of all silicon oxides and other contaminants according to well-known methods. The layer of chromium 73 and then the layer of tin 27 are deposited by vapor deposition process to the back of wafer 10 as described in more detail below.

in FIG. 4, a vacuum chamber 31 comprises a bell jar 30 supported on a base 32. A conduit 34 communicates between a vacuum pump (not shown) and the vacuum chamber. Supported within the vacuum chamber, in thermal insulation from the jar 30 and base 32, is a platen 36 comprised of, for example, stainless steel. The silicon wafer 10 is supported on the underside of this platen in a known manner, with the reverse surface 25 of the silicon wafer 10 facing downwardly. A heater 38 may be provided for heating the platen 36 and silicon wafer 10 in a known manner.

Beneath the platen 36 is a shield or shutter 40, mounted and arranged to be moved, as by handle 42, into and out of a position directly below the wafer 10 for shielding it when desired.

Within the chamber 31 and below platen 36 and shutter 40 is a rotary table 44 carrying containers or crucibles 46 and 48 containing the metals to be vapor deposited on the wafer 10, specifically, chromium and tin respectively, in their solid form. Each of these metals may be evaporated by rotating the table 44 to bring the desired container 46 and 48 into alignment with an electron beam path 51 of an electron gun 50.

After the integrated circuits 12 are formed on the obverse surface 13 of the silicon wafer 10, the reverse surface 25 of the silicon wafer is suitably cleaned to remove all unwanted impurities by well-known means. The wafer 10 is mounted on the lower face of the platen 36 (FIG. 4) as mentioned above with its clean reverse surface 25 facing downwardly. By means of the vacuum pump, the chamber 31 is evacuated in a pressure of approximately $10^{-6}$ torr. The heater 38 may be energized for heating the platen 36 and silicon wafer 10 uniformly to a temperature not to exceed 200° C. Alternatively, the silicon wafer 10 may be left at room temperature.

Initially, the shutter 40 is swung into position directly below the silicon wafer 10 for shielding it.

The table 44 is then rotated to the position for bringing the crucible 46 containing solid chromium into alignment with the path 51 of electrons from the electron gun 50, which is then energized to heat and evaporate the chromium. Preferably, the shutter 40 is kept in place directly below the silicon wafer 10 for about 30 seconds during initial heating of the chromium in the crucible 46 by the electron gun 50, so that any surface contaminants on the solid chromium, which will evaporate easily, will be deposited on the underside of shutter 40. The operation of the apparatus having been calibrated in a previous test, the electron gun 50 is operated at an intensity that will deposit the desired layer of about 150 angstroms of chromium in about 30 seconds.

The shutter 40 is then swung away from shielding position so the chromium molecules evaporated from the melted chromium in the crucible 46 will deposit on the exposed reverse surface 25 of the silicon wafer 10. After the 30 seconds required for the layer 73 of chromium on the wafer 10 has reached the desired thickness, the shutter 40 is swung into shielding position below the wafer 10 and the electron gun 50 is deenergized.

The table 40 is then rotated to bring the to other crucible 48 containing tin into alignment with the electron beam path 51 of the electron gun 50. The electron gun 50 is then energized for about 30 seconds to heat the tin in the crucible 48 and drive off contaminants. The electron gun 50 is operated at an intensity to deposit a film of tin of substantially 10,000 angstroms in about thirty seconds. Then, the shield 40 is swung away from shielding position for the thirty seconds required to cause the deposition of the layer 27 of tin. The shutter 40 is then swung into place below the silicon wafer 10 to terminate the deposition, the electron gun 50 is deenergized, air is admitted into the vacuum chamber, and the silicon wafer 10 is removed.

The silicon wafer 10 is then scribed and broken into individual chips, such as the chip 14 in FIG. 2. Each such chip then has an integrated circuit 12 on its obverse face 13 and layers of chromium and tin on its reverse side 25.

Figure 5:
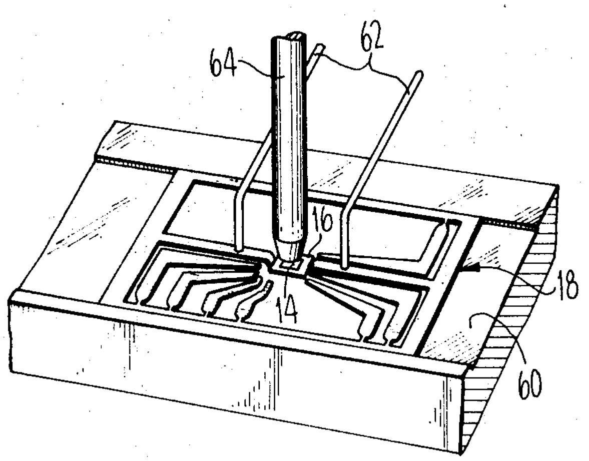
FIG. 5 is a view of apparatus for assembling a single integrated circuit chip to a lead frame.

As shown in FIG. 5, a gold-plated lead frame 18 is placed on a hot table 60, held down by clamps 62 so that it is heated to a temperature of about 217° C. or slightly above, as for example, 220° to 225° C. The individual chip 14 may then be picked up with tweezers and manually laid in place on the mounting pad 16 of the frame 18. Since the temperature is above the melting point of gold-tin eutectic, such a eutectic bonds the chip 14 to the mounting pad 16. This bonding can be accomplished without pressure simply by laying the chip 14 on the mounting pad 16. Alternatively, the chip 14 may be held in a vacuum chuck 64, also shown in FIG. 5. Such vacuum chucks are well known. Such a chuck may be movable laterally to any position for picking up the individual chips. The vacuum chuck 64 may be lowered, as shown in FIG. 5, for placing the chip 14 on the mounting pad 16 of the lead frame 18, and may be employed for applying slight pressure downwardly, if desired, of a magnitude of about a few grams.

Thus, the method of my present invention provides a strong solderlike bond between the silicon base of the integrated circuit chip and the gold surface of the lead frame 18 and does so in an efficient operation while avoiding excess heating of the chip and the circuit elements thereon.

I claim:

1. A method of bonding silicon to gold, comprising the steps of:
- forming a coating of chromium on a surface of the silicon;
- forming a coating of tin on a surface of the chromium coating;
- heating said gold and said silicon with said chromium and tin coatings to at least the melting temperature of the eutectic alloy of tin and gold; and
- placing a surface of said tin in contact with a surface of said gold for causing a bond of gold-tin eutectic to form at said melting temperature.

2. The method according to claim 1 wherein said temperature is about 217° C.

3. A method of bonding a silicon-surfaced electronic circuit device to a gold-surfaced support member comprising the steps of:
- vapor-phase depositing a layer of chromium on the silicon surface of said circuit device;
- vapor-phase depositing a layer of tin on a surface of the layer of chromium;
- placing a surface of the tin layer against the gold surface of said support member; and
- raising the temperature of the gold and tin to about 217° C. for forming a gold-tin eutectic alloy, thereby bonding said device to said support member.

4. A method in the making of an integrated circuit device which comprises the steps of:
- forming a plurality of integrated circuits on one face of a silicon wafer;
- vapor phase depositing chromium on the opposite face of said wafer;
- vapor phase depositing tin on the chromium so deposited;
- separating said wafer into a plurality of chips, each chip having an integrated circuit contained thereon;
- placing individual ones of said separated chips on individual gold-surfaced mounting pads so that said tin of the chip is in surface contact with the gold surface of the mounting pad; and
- heating the thus contacted chips and mounting pads to a gold-tin eutectic alloy forming temperature.

5. An electronic device comprising:
- a substantially flat member of silicon having an obverse surface and a reverse surface;
- an integrated circuit disposed on said obverse surface;
- a layer of chromium on said reverse surface;
- a layer of tin on said layer of chromium; and
- a gold-surfaced mounting member in eutectic bonded relation with said layer of tin.

6. An electronic device comprising:
- a substantially flat member of silicon having an obverse surface and a reverse surface;
- an integrated circuit disposed on said obverse surface, said integrated circuit including layers of material that operatively degenerate at temperatures above a predetermined temperature;
- a gold-plated base member; and
- a layer of bonding material in adhesive contact with said reverse surface of said silicon member and in eutectic bond with the gold plating of said base member; said bonding material being a material which forms said eutectic bond at a temperature less than said predetermined temperature.

7. An electronic device according to claim 6 wherein said layer of bonding material includes a layer of chromium in adhesive contact with said reverse surface of said silicon member, and a layer of tin in eutectic bond relation with said gold plate; said chromium and said tin being in adhesive relation with each other.